United States Patent
Penzes (10) Patent No.: US 8,266,561 B2
(45) Date of Patent: Sep. 11, 2012

(54) SYSTEMS AND TECHNIQUES FOR DEVELOPING HIGH-SPEED STANDARD CELL LIBRARIES

(75) Inventor: Paul Penzes, Newport Beach, CA (US)

(73) Assignee: Broadcom Corporation, Irvine, CA (US)

( * ) Notice: Subject to any disclaimer, the term of this patent is extended or adjusted under 35 U.S.C. 154(b) by 298 days.

(21) Appl. No.: 11/941,286

(22) Filed: Nov. 16, 2007

(65) Prior Publication Data

US 2009/0083691 A1    Mar. 26, 2009

Related U.S. Application Data

(60) Provisional application No. 60/974,116, filed on Sep. 21, 2007.

(51) Int. Cl.
*G06F 17/50* (2006.01)
(52) U.S. Cl. ......... 716/104; 716/100; 716/101; 716/102
(58) Field of Classification Search .................. 716/1, 5, 716/6, 17, 100, 101, 102, 104
See application file for complete search history.

(56) References Cited

U.S. PATENT DOCUMENTS 6,498,515 B2 * 12/2002 Kawakami et al. ............ 326/121
2006/0215457 A1 * 9/2006 Mukaihira ............... 365/185.23

* cited by examiner

*Primary Examiner* — Vuthe Siek
(74) *Attorney, Agent, or Firm* — Sterne, Kessler, Goldstein & Fox PLLC (57) ABSTRACT

A method for providing a high-speed cell library is provided. The method can include, for example, selecting a set of commonly-occurring logic functions. The method can then include obtaining a netlist of area distributions for each of the set of functions. The netlist can be used to synthesize a set of cell libraries wherein an N-diffusion to P-diffusion area allowance is varied among the set of cell libraries. Thereafter, the method may also include comparing a time delay associated with each of the set of cell libraries with a time delay of a library benchmark delay. Based on the comparing, a delay number may be associated with each of the cell libraries. Finally, the cell libraries may be ranked based on the respective delay numbers associated with each of the cell libraries.

17 Claims, 10 Drawing Sheets

SYSTEMS AND TECHNIQUES FOR DEVELOPING HIGH-SPEED STANDARD CELL LIBRARIES

CROSS-REFERENCE TO RELATED APPLICATION

This application claims priority from U.S. Provisional Patent Application No. 60/974,116, filed on Sep. 21, 2007, entitled, "Techniques and Apparatus for Developing High-Speed Standard Cell Libraries".

FIELD OF TECHNOLOGY

This invention relates to developing high-speed standard cell libraries. More particularly, this invention relates to systems and methods that can obtain a substantial speed improvement in the use of standard cell libraries.

BACKGROUND OF THE INVENTION

State-of-the-art design of integrated circuits (micro chips) includes specifying the functionality of the chip in a standard hardware programming language such as Verilog (a hardware description language used to design and document electronic systems), synthesizing/mapping the circuit description into basic gates of a standard cell library using computer-aided design (CAD) tools such as Synopsys' DesignCompiler, produced by Synopsys, Inc. of Mountain View, Calif., placing and routing the gate netlist using CAD tools such as Magma's BlastFusion, produced by Magma, Inc. of San Jose, Calif., and finally verifying proper connectivity (LVS) and functionality of the circuit.

While all of these steps are important for the final quality of the integrated circuit, for most of these steps the achievable quality of implementation is design dependent. For example, a good Verilog code specifying circuit A does not make an independent circuit B any better. However, an efficient standard cell library—i.e., a group of cells used in forming circuits—makes all designs better. In other words, the quality of the standard cell library influences can influence any design that uses the standard cell library. Accordingly, the quality of the standard cell library can influence the quality of chips.

With the advent of technology scaling, higher and higher levels of integration became possible due to the shrinking device sizes. At the same time, the technology scaling was providing not only an area scaling but also a delay scaling. According to Moore's "Law", chips were doubling their speed every 18 months. While this "law" has been applicable for more than 20 years, technology has come to a point where process scaling no longer delivers the expected speed increases. This is mainly due to the fact certain device parameters have reached atomic scales. The trend among devices is that the devices are moving from 0.065 micron to 0.040 micron technologies. A major foundry is projecting similar trends not only for current offerings of 0.040 micron but also for the future 0.032 micron technologies. One of the consequences of this speed saturation due to technology scaling is that designers need to work harder at each stage of the design flow to squeeze out the last remaining circuit performance advantages.

Put another way, even small speed improvements will come at significantly higher design efforts than in the past. Accordingly, it would be desirable to have improved standard cell libraries, as this is one element that greatly influences a wide range of products.

SUMMARY OF THE INVENTION

A system and/or method for developing high-speed standard cell libraries, substantially as shown in and/or described in connection with at least one of the figures, as set forth more completely in the claims.

BRIEF DESCRIPTION OF THE DRAWINGS

The objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

In the following description of the various embodiments, reference is made to the accompanying drawings, which form a part hereof, and in which is shown by way of illustration various embodiments in which the invention may be practiced. It is to be understood that other embodiments may be utilized and structural and functional modifications may be made without departing from the scope and spirit of the present invention.

As will be appreciated by one of skill in the art upon reading the following disclosure, various aspects described herein may be embodied as a method, a data processing system, or a computer program product. Accordingly, those aspects may take the form of an entirely hardware embodiment, an entirely software embodiment or an embodiment combining software and hardware aspects. Furthermore, such aspects may take the form of a computer program product stored by one or more computer-readable storage media having computer-readable program code, or instructions, embodied in or on the storage media. Any suitable computer readable storage media may be utilized, including hard disks, CD-ROMs, optical storage devices, magnetic storage devices, and/or any combination thereof. In addition, various signals representing data or events as described herein may be transferred between a source and a destination in the form of electromagnetic waves traveling through signal-conducting media such as metal wires, optical fibers, and/or wireless transmission media (e.g., air and/or space).

This patent application describes a set of original techniques that, when applied to a standard cell library, such as the Broadcom Standard Cell Library manufactured by Broadcom Corporation of Irvine, Calif., for use on Broadcom integrated circuits, may result in a speed improvement of more than 10%.

When it comes to a high-speed standard cell library, one of the most difficult choices is to determine which cells to add to the library. With respect to cell selection, the types of logical functions (inversion, inverting and, inverting or, Xor, flip-flop) to have represented in the library may be less important than which drive strengths and which P-transistor to N-transistor ratios of those logical functions are available in the library. There is always a design, characterization, and maintenance cost associated with adding extra cells into a standard cell library. This is why one tries to keep the number of cells in a library as small as possible. Simulations of integrated circuits show that their speed performance is relatively invariant to small variations of device sizes (transistors). Because of this property, one does not have to have all device sizes of a logic function implemented in a particular library; a quantified version of them performs sufficiently well.

One goal of a high-speed library is to minimize the delay of circuits synthesized using the high-speed library. A secondary goal is to achieve these speeds at minimal area/power cost. In other words, it would be desirable to have the smallest physical implementation of the logical function for a given speed.

Standard cells are designed so that they can be tiled next to each other in any suitable combination. This architecture restriction can impose a certain design style on the cells. Additionally, CMOS (Complementary Metal Oxide Semiconductor) physical design rules (layout rules) require a certain distance between N-diffusion and P-diffusion islands (the areas that form the N and P transistors, respectively). This distance is larger than the necessary distance between distinct N-diffusion regions or distinct P-diffusion regions (in 65 nanometer low-power integrated circuits—0.32 micron for N to P vs. 0.13 micron for N to N or P to P). In order to allow close tiling of these cells, it is customary to pick a certain N-diffusion/P-diffusion template for all cells of the standard cell library.

To operate at its optimal speed, each individual cell may require a particular N-diffusion/P-diffusion area allowance, which might be quite different than the one for the entire library. Thus, there are two different design constraints that one would like to mitigate with respect to a cell's N-diffusion/P-diffusion allowance: one for speed and one for area. Accordingly, one step of a technique for designing high-speed cell libraries according to the invention is to determine an appropriate point for the trade-off between speed and area.

The following rules may be implemented in methods according to the invention for optimizing the standard cell libraries according to the invention.

1) Library-Wide Optimal N-Diffusion and P-Diffusion Allocation

One factor in library development according to the invention includes isolating and/or selecting a preferably small set of commonly-occurring logic functions that are directly implementable in a single stage of CMOS logic. In one embodiment of the invention, the set of commonly-occurring logic functions can be determined experimentally by collecting statistics of cell usage on the critical paths of circuits. Typically, complex logic gates do not appear on the critical path of circuits.

This small set of commonly-occurring functions can include, but may not be limited to: an INVERTER, a 2-input inverting NAND gate, a 2-input inverting NOR gate, and a D-type FF (Flip-Flop). Initially, a method according to the invention may provide a physical implementation that delivers a pre-established unity drive strength for the given height selected for the cell template. The method may also select an initial N-diffusion to P-diffusion area allowance, which in the case of the chosen cells could be one—i.e., the area allotted for the N-diffusion may be substantially equal to the area allotted for the P-diffusion.

The initial allowance choice may only be a starting point for a selection technique according to the invention. In fact, the ultimate selection of area allotment between the N-diffusion and the P-diffusion may be independent of the initial selection, as will be explained in more detail below.

A next step in the method according to the invention may be that a layout of the small set of commonly-occurring cells is generated under the pre-established conditions set forth above—i.e., conditions setting forth the drive strength for the given height and the area allotted for the N-diffusion with respect to the area allotted for the P-diffusion.

Figure 1:
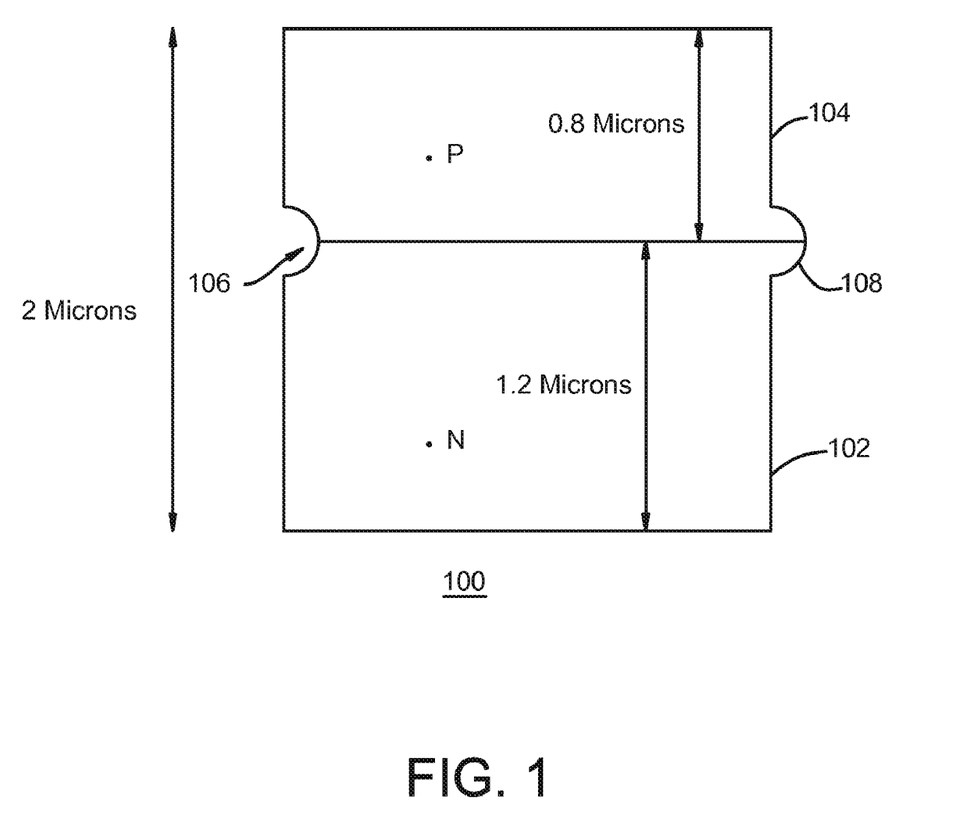
FIG. 1 is a schematic diagram of one exemplary cell.

FIG. 1 shows NAND cell 100 having a total exemplary cell height which is 2 microns. In exemplary cell 100, the optimum height for the N-diffusion area 102 can be 1.2 microns and the optimum height for the P-diffusion area 104 can be 0.8 microns. Accordingly, semicircles 106 and 108, which represent notches in the cell that dictate where the P Area with respect to N Area (P/N) on the cell will be allocated and whose shape allows each cell to fit easily with an abutting cell, may be designed to have midpoints that are both 1.2 microns from the bottom edge of the cell and the 0.8 microns from the top edge of the cell.

FIG. 1 shows one exemplary cell. Other cells have different constraints with respect to the height of the N-diffusion area and the P-diffusion area.

In order to obtain a height that is suitable for the greatest number of cells in the library, these cells may be extracted and parameterized—i.e., each cell is evaluated to determine which height is preferable for that cell—in order to obtain the resulting netlist. The netlist includes the most preferred heights for the N-diffusion and P-diffusion areas, and, consequently, the P/N allocations, for each of the cells.

Using this parameterized netlist, a set of "synthetic" libraries may be generated, where the area of the N-diffusion to P-diffusion allowance is varied, and, consequently, the P/N allocation is varied, while keeping the total cell height the same. These exemplary libraries change the P/N allocation while keeping the sum of the device heights constant.

One purpose of generating these synthetic libraries is to facilitate quick experimentation without the need for undertaking the laborious layout process for each separate library and then testing each separate library individually. What is interesting to note is that while the P/N allocation may change, the capacitances (not captured in the transistor parameters) stay substantially constant, independent of changes made to the P/N allocations. This allows using an iterative process to determine which cells are implementable with the expected performance.

A large set of representative circuits may then be taken—which may form a group referred to herein as a library benchmark—and synthesized using the parameters set forth with respect to the various synthetic libraries. The average of the resulting circuits' speed is determined and, in response to the determination, a delay number is attached to each of the synthetic libraries. The synthetic library that resulted in the highest average circuit speed may then be selected. With the corresponding N-diffusion to P-diffusion allowance, a layout of the corresponding library is physically regenerated.

Through this process, the single P/N allocation with the highest average circuit speed for the entire library is established. Specifically, this P/N allocation method ensures that the most-used cells are functioning at close to their respective optimum speeds.

Figure 2:
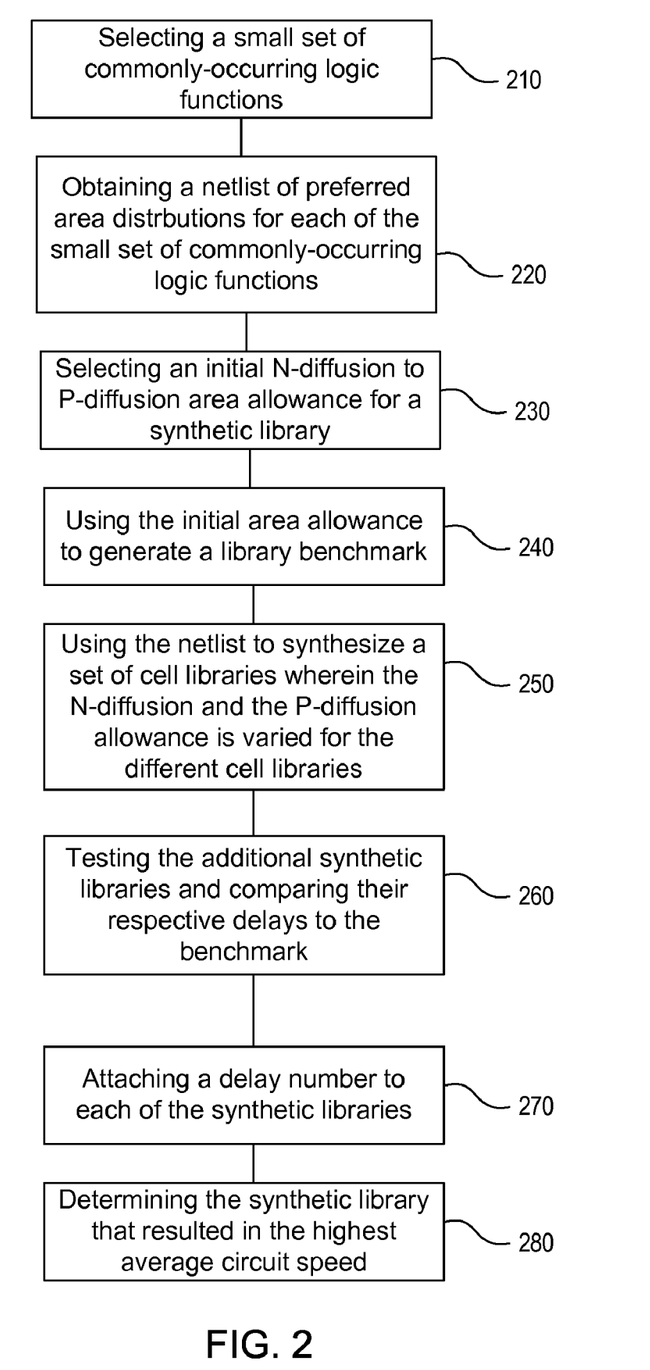
FIG. 2 is a flow diagram of a method according to the invention that can be used to optimize a cell library according to the invention.

FIG. 2 shows a method according to the invention that can be used to optimize a cell library according to the invention. Step 210 shows selecting a preferably small set of commonly-occurring logic functions that are directly implementable in a single stage of CMOS logic. Step 220 shows obtaining a netlist of preferred area distributions for each of the small set of commonly-occurring logic functions. Step 230 shows selecting an initial N-diffusion to P-diffusion area allowance for a synthetic cell library. Step 240 shows using the initial area allowance to generate a library benchmark. Step 250 shows using the netlist to synthesize a set of cell libraries wherein the area of the N-diffusion to P-diffusion allowance is varied between the synthesized cell libraries. Each of the synthesized (or, alternatively, "generated") cell libraries have a different distribution of area between the N-diffusion area and the P-diffusion area. Step 260 shows testing the additional synthetic libraries and comparing their respective delays to the library benchmark. Step 270 shows attaching a delay number to each of the synthetic libraries based on the comparison. The cell libraries are ranked based on the respective delay numbers associated with each of the cell libraries. Step 280 shows determining the synthetic library that resulted in the highest average circuit speed, and, according to the corresponding N-diffusion to P-diffusion allowance, physically generating a layout of the corresponding library.

2) Locally Optimal P/N Allocation

An additional useful rule for the implementation of high-speed libraries relates to CMOS circuits. In static CMOS, both the rising and the falling transitions can become speed critical. Accordingly, it is important to optimize a cell in a library for minimal rise transition plus fall transition. Such a value may also be characterized alternatively as minimal average transition.

Figure 3:
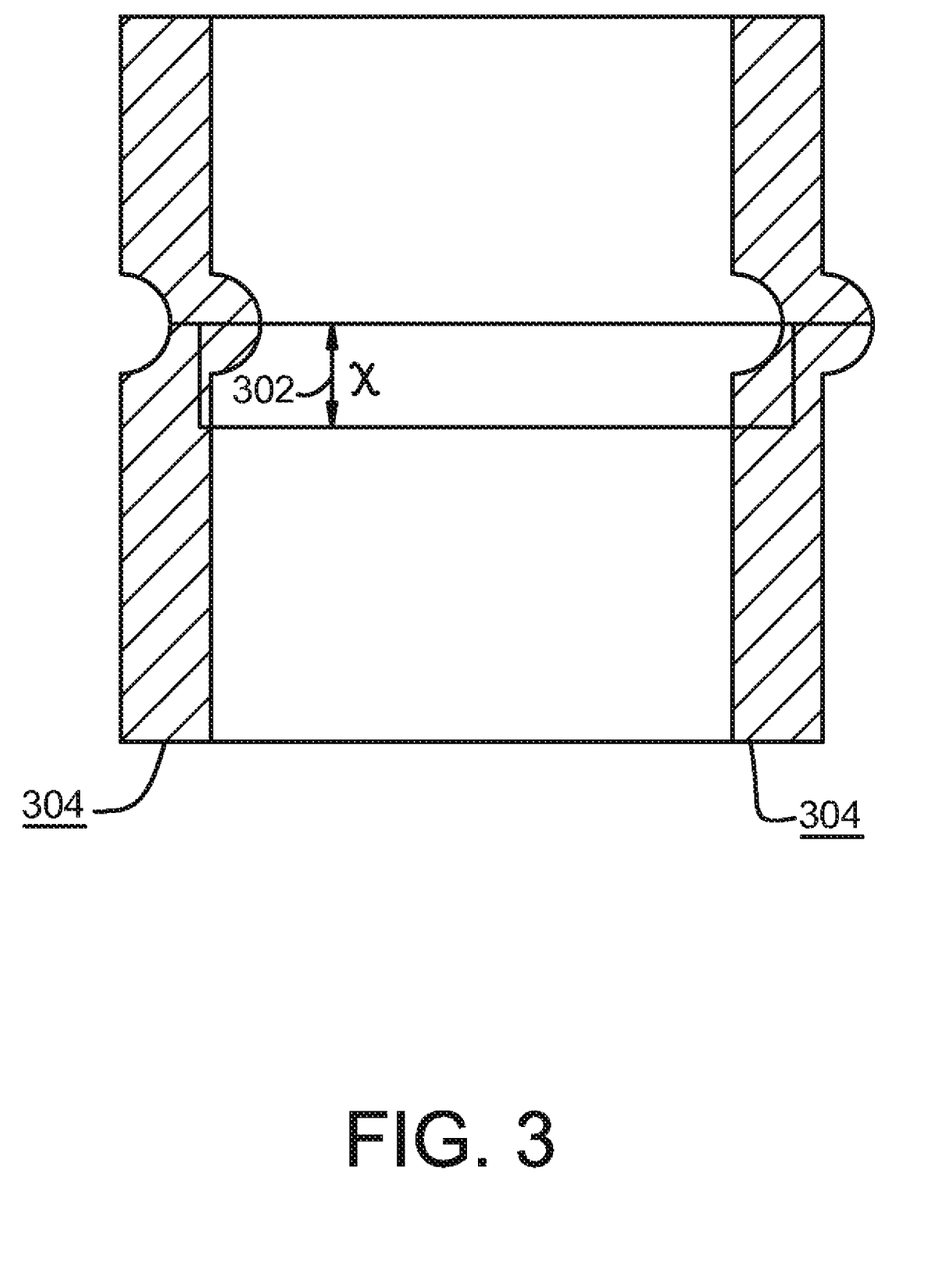
FIG. 3 is a schematic diagram of a second exemplary cell.

In a further embodiment of this rule according to the invention, for any logic function that reaches its speed minimum further away from the common P/N allocation of the library, as determined, for example, by the method set forth above in the flow diagram set forth in FIG. 2, a specific instance of that cell can be implemented using the optimal P/N ratio. FIG. 3 shows a cell that meets its speed minimum at distance x at 302 from the common allocation of the library. In order to overcome the fact that the cell 300 does not have optimum P/N allocation for its particular circuit, side sections 304 may be appended to cell 300 such that, while cell 300 may be somewhat wider than otherwise required, cell 300 can still be adapted to fit with other cells using the optimal P/N allocation as determined using method 200 above.

This way, some logic functions will have separate implementations for the same drive strength, an implementation that is smaller but not the fastest on average, and one implementation that is the fastest possible, but potentially slightly larger due to the extra N-diffusion to P-diffusion separation 304 needed between this cell and the rest of the cells in the library. The fact that there is a substantially globally optimal P/N allocation preferably ensures that there would be fewer extra cells worthy to be added. This technique—i.e., appending additional area onto the cell as needed—preferably maintains the number of cells as small as possible, while keeping up the performance of the library.

3) Extra Drive Strength

Figure 4:
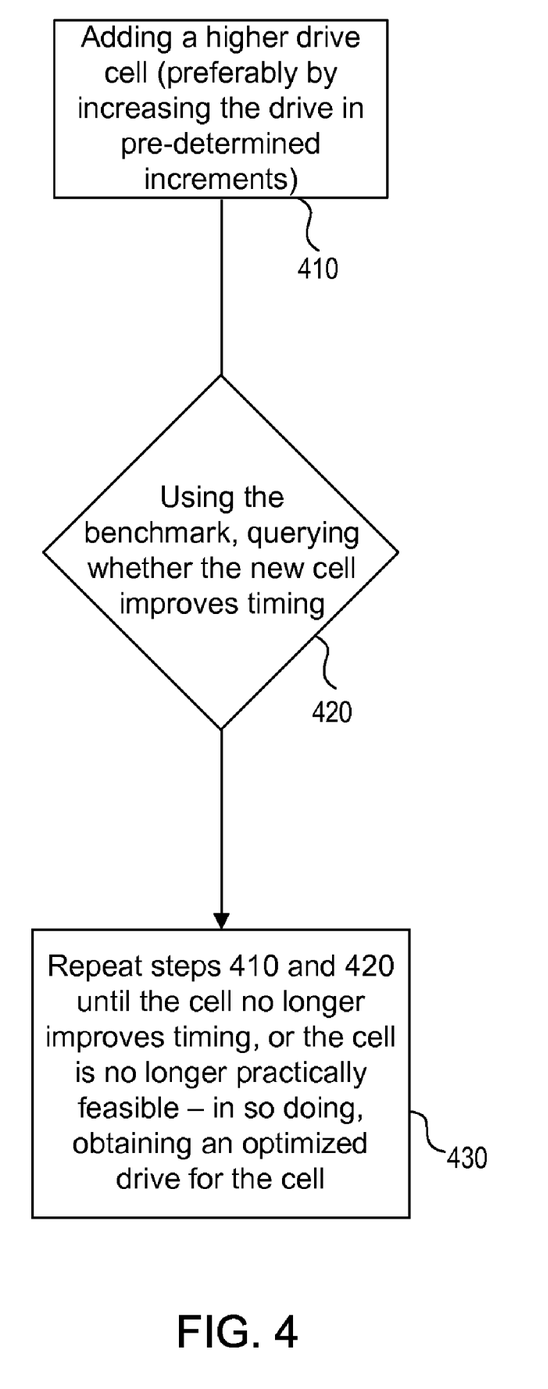
FIG. 4 is a flow diagram of a method according to the invention that can be used to add extra drive strength to existing logic functions.

An additional technique in developing a high-speed library can be to add extra drive strength to the existing logic functions. An iterative process may be followed in this case as well. FIG. 4 shows that, for each logic function, a higher drive cell may be added (preferably in pre-established drive increments), as shown in step 410. Using the library benchmark, as described above, it can be established whether this new cell improves timing, as shown in step 420.

This procedure of adding higher and higher drive strength cells may be repeated until either the new cell does not help timing anymore or the cell is no longer feasible in practice. In either case, the new cell is not added to the library and the iteration process for that logic function is terminated. In one embodiment of the invention, the naming convention for different drive strength uses the letter X followed by a number "n": Xn, where n denotes the relative drive strength. By convention, the drive strength of a gate that is not folded and occupies the entire cell template size is X2. If that gate is folded once, for example, then its drive strength is denoted X4. If the relative drive strength "n" is not an integer, say it is "1.7", the letter P may be used instead of the period; thus the name would be X1P7.

4) Skewed High/Low Cells

Figure 5:
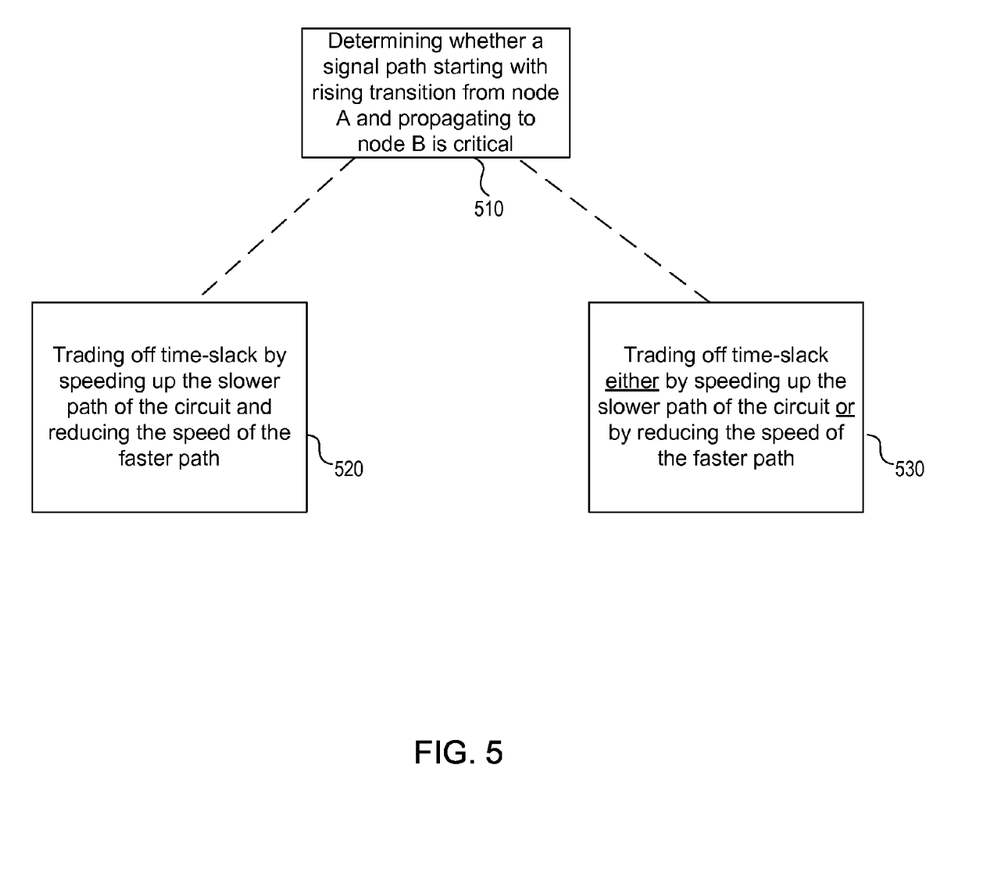
FIG. 5 shows a flow diagram of a method according to the invention that can be used to reduce timing slack in a circuit.

While on average the cells sized for locally optimal P/N allocation perform best, there are cases where it is beneficial to have the same logic function also implemented using a different P/N allocation. FIG. 5 shows a method of reducing timing slack in a circuit.

This is because in a static CMOS circuit, if a path from node A to node B, starting with a rising transition on A and propagating to B is critical, then the alternate path starting with a falling transition on A and propagating to B may permit some timing slack, as shown in FIG. 5, step 510. This timing slack could be traded-off—via high/low skewed gates—by speeding up the slower path, for example by enlarging the slower path channel, while slowing down the faster one—e.g., by reducing the faster path channel—until there is no more slack to be taken away, as shown in step 520. Alternatively, either one of the steps of speeding up the slower path or reducing the speed of the faster path could be implemented, as shown as an alternative path in step 530. One exemplary naming convention for these cells with different P/N allocations uses the letter Y followed by number "n": Yn, where n denotes the ratio between the P transistors and N transistors.

Using this notation, the locally P/N allocation optimal cell may be considered just another cell with a particular Yn value. In other words, for each logic function two parameters have been obtained—one for the drive strength X and one for the P/N allocation Y. If all these cells were to be implemented in the standard cell library, the number of entries would be very large. Using a method according to the invention, however, by only adding different Y entries for a handful of commonly used cells, most of the remaining slack of the circuit could be eliminated. Simulations have determined that the most common gates with different Y entries include the following: INVERTER gates, 2/3/4-input inverting NAND gates, and inverting AND-OR 21 gates.

5) Logic Gates Optimized for Different Discharge Paths

Figure 6:
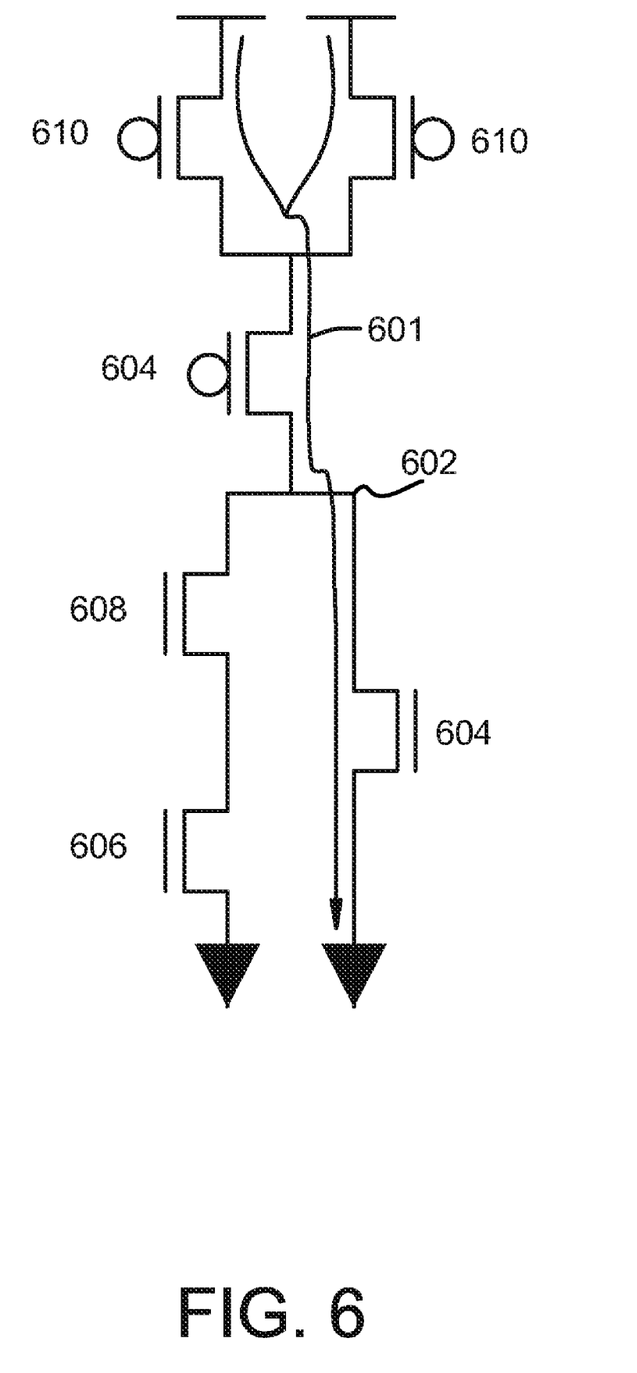
FIG. 6 shows a schematic diagram of one embodiment of a AND-OR-21 (two-to-one) gate.

Certain gates are symmetric in their respective inputs—i.e., the computed logic function remains the same independent of the input permutation. For example, an AND-OR-21 (two-to-one) gate 600 as shown in FIG. 6 is symmetric in its inputs, such that it computes the same function even if the two inputs are interchanged. However, this property is not true for many circuits. For non-symmetric logic functions there often is more than one context in which that cell could end up on the critical path. For these situations, different implementations of the same cell can be useful. Take for example an inverting AND-OR 21 gate, as the one depicted in the FIGS. 6 and 7.

The arrow 601 shows one discharge scenario of gate 600. Node 602 is pulled low when input signals (associated with transistor gates) 604 are high and at least one of the inputs at gates 606 or 608 is low. Node 602 is pulled high when inputs 604 are low and one of the inputs 606 or 608 is low as well.

This cell topology is optimal for the case when input signals 604 are the critical signals coming into the gate. This is because input signals 604 are physically closest to the output node 602 for both rising and falling transitions. Furthermore, under the assumption that inputs 604 receive the critical signal, the widths of the N-transistors controlled by gates 606 and 608 could be shrunk to reduce the capacitance on output node 602 and thus further increase the operational speed of this gate.

Figure 7:
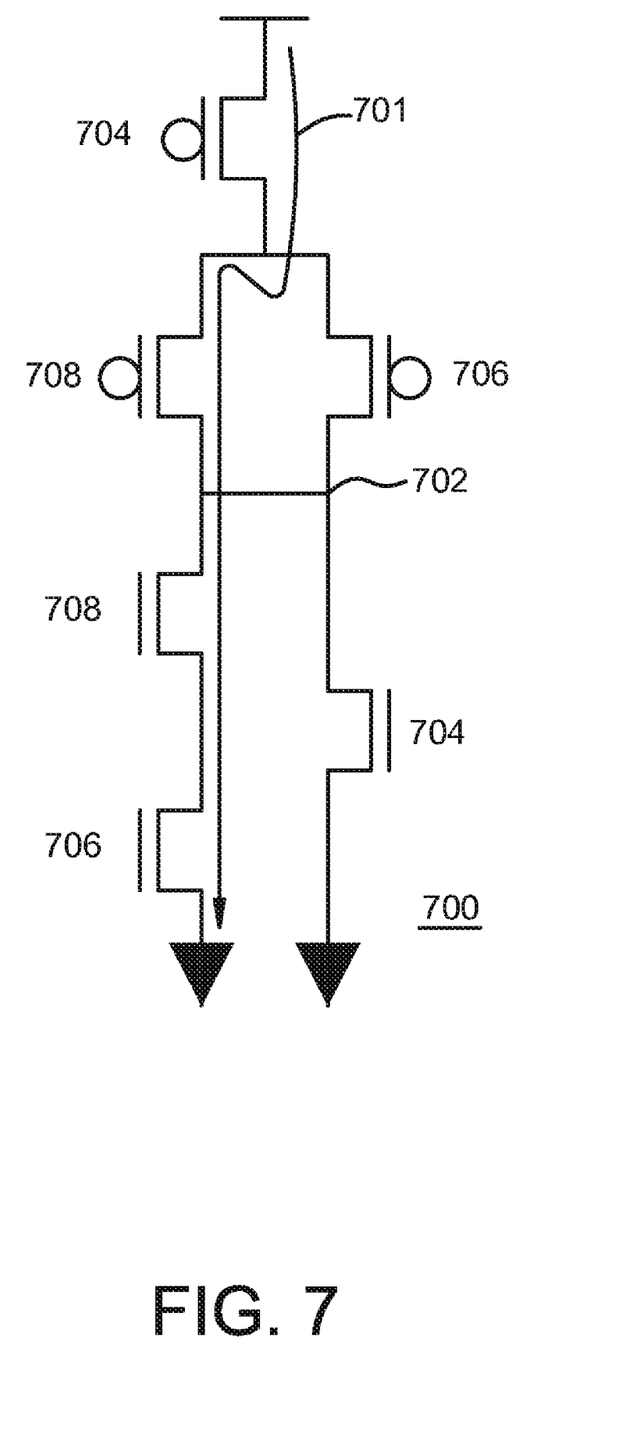
FIG. 7 shows a schematic diagram of a second embodiment of a another embodiment of a AND-OR-21 (two-to-one) gate.

FIG. 7 below shows another scenario of discharge 701 based on a different implementation of an AND-OR-21 (two-to-one) gate 700.

Here, it is assumed that input signal 708 is the critical one (note that this gate is symmetric in 706 and 708—i.e., these gates can be interchanged without altering the value of the logic function; however, this is not true if one were to interchange 704 with any other input). The second topology is optimal for the case when 708 is late, as now it is 708 that is physically closest to output 702. As 704 is assumed to be early, the N-transistor controlled by 704 can be shrunk to reduce the capacitance on the output 702. Arrow 701 shows an optimal discharge path for circuit 700.

As is noticeable, while each of the topologies shown in FIGS. 6 and 7 implements the same logical function, their respective electrical properties are quite different. For this particular cell, these two scenarios are of primary importance, but for more complex gates the number of scenarios can be larger. Thus, when one is dealing with two different cells which happen to implement the same logic, different variations of the same cell may be added into the standard cell library. In order to distinguish between these variations of cells, a letter Z followed by a number "n" may be used—i.e., Zn, where "n" is the index of the variation. Some other examples that can take advantage of different variations of cells include, but are not limited to: inverting AND or inverting OR with 2/3/4 inputs having one of the inputs inverted, inverting OR-AND 21 gate, inverting AND-OR 31, and inverting OR-AND 31.

Figure 8:
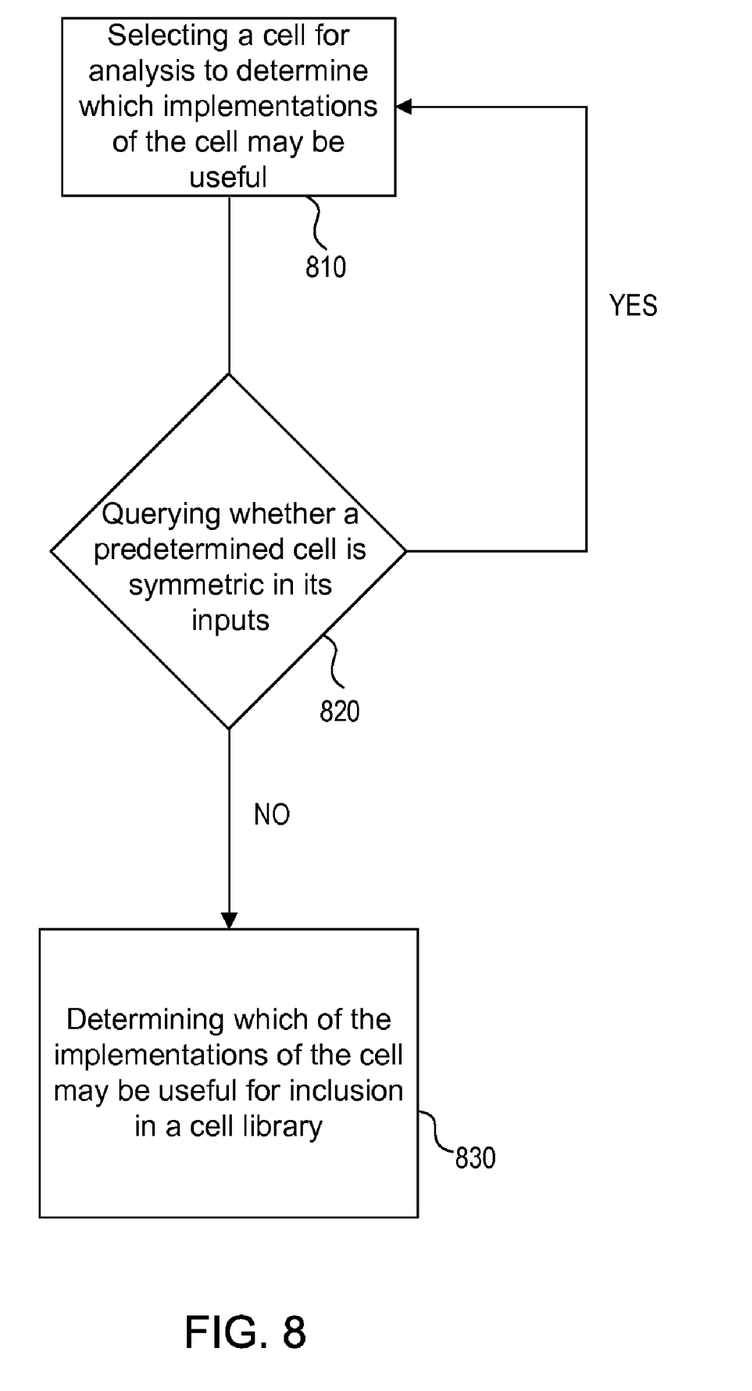
FIG. 8 shows a flow diagram of a method according to the invention for determining which implementations of a cell can be useful to a cell library.

FIG. 8 shows a flow diagram of a method according to the invention. Step 810 shows selecting a cell for analysis to determine which implementations of the cell may be useful, for example, to a cell library. Step 820 shows querying whether a predetermined cell is symmetric in its inputs. Step 830 shows that if the cell is not symmetric, determining which of the implementations of the cell may be useful for inclusion in a cell library.

Through the steps presented above, a set of techniques to design high speed standard cell libraries to be used in the synthesis of digital circuits have been shown and described.

6) Multi-Stage Gates

In practice, it may be sometimes useful to have gates that combine several stages into one single cell. Collecting cell usage statistics on net lists synthesized using only single-stage cells can gives an indication of which single-stage cells to combine into one merged cell.

In many simulations, combining an inverter either into the output of the gate or into one of the inputs of the gate has been found to be the most useful merging of cells. Merging two cells is advantages at least because the wiring between the two cells is reduced and, sometimes, the power and ground contacts can be shared, thus reducing the area of the cell.

However, the number of combinations in which cells could be combined is quite large, considering that each cell already has 3 parameters X, Y and Z, as described above. A stage-ratio between two consecutives single-stage cells of between 2 and 4 cells works well in practice. Furthermore, the two cells are preferably not combined sub-optimally into one merged cell. Rather, the two cells are preferably re-optimized such that the delay through the merged cell when the input is rising is the same as the delay through the cell when the input is falling. This re-optimization often adds an extra 10% speed improvement to the compound cell, when compared to the suboptimal juxtaposition of those cells.

Figure 9:
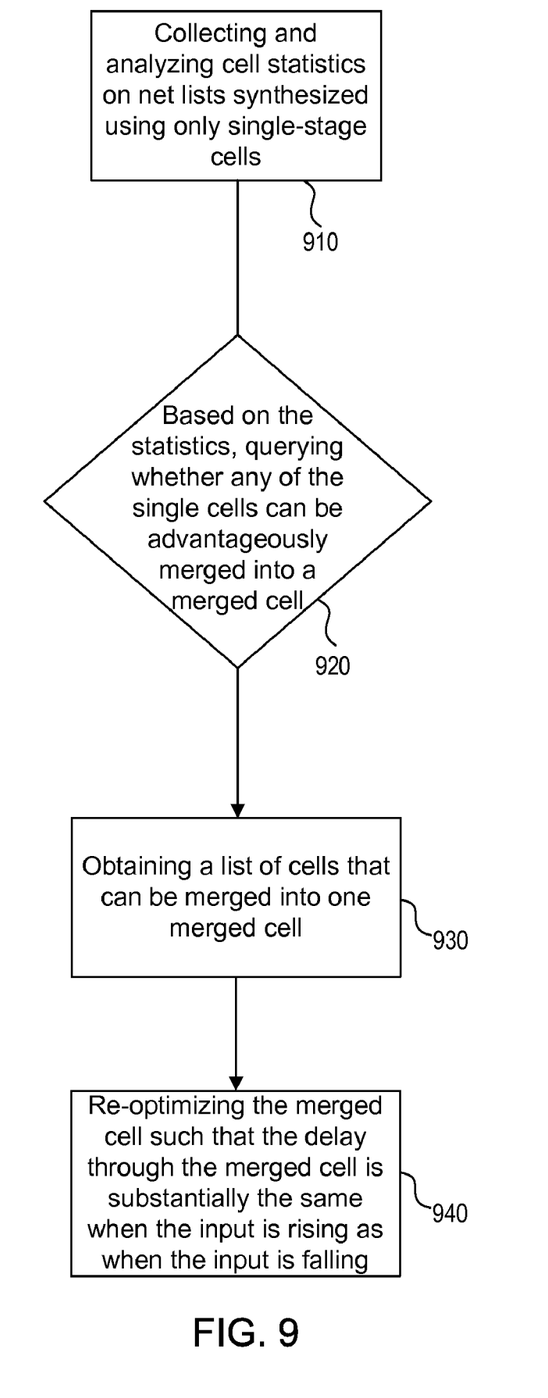
FIG. 9 shows a flow diagram of a method according to the invention of merging cells.

FIG. 9 shows a method according to the invention of merging cells. Step 910 shows collecting and analyzing cell statistics on net lists synthesized using preferably only single-stage cells. Step 920 shows querying whether any of the single cells can be advantageously merged into a merged cell. The method preferably obtains a list of cells that can be merged into a single merged cell, at step 930. This list of cells may be based on the statistics obtained in step 910. From the list of cells that are to be merged, the method may re-optimize such merged cells such that the delay through the merged cell is substantially the same when the input is rising as when the input is falling.

Figure 10:
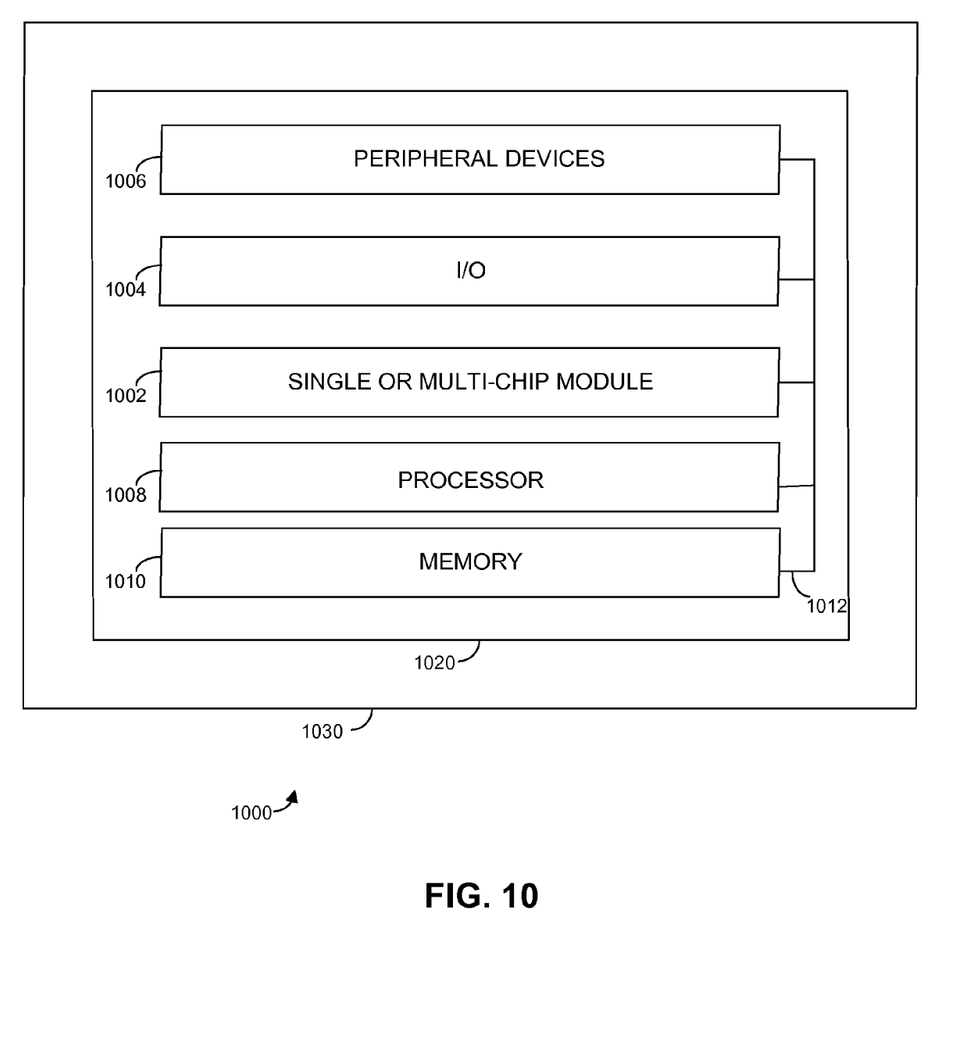
FIG. 10 is a schematic diagram of an illustrative single or multi-chip module of this invention in a data processing system.

FIG. 10 shows a single or multi-chip module 1002 according to the invention, which can be one or more integrated circuits, in an illustrative data processing system 1000 according to the invention. Data processing system 1000 may include one or more of the following components: I/O circuitry 1004, peripheral devices 1006, a processor 1008 and memory 1010. These components are coupled together by a system bus or other interconnections 1012 and are populated on a circuit board 1020 which is contained in an end-user system 1030. System 1000 may be configured for use with high-speed standard cell laboratories according to the invention. It should be noted that system 1000 is only exemplary, and that the true scope and spirit of the invention should be indicated by the following claims.

The invention may be described in the general context of computer-executable instructions, such as program modules, being executed by a computer. Generally, program modules include routines, programs, objects, components, data structures, etc. that perform particular tasks or implement particular abstract data types.

Aspects of the invention have been described in terms of illustrative embodiments thereof. A person having ordinary skill in the art will appreciate that numerous additional embodiments, modifications, and variations may exist that remain within the scope and spirit of the appended claims. For example, one of ordinary skill in the art will appreciate that the steps illustrated in the figures may be performed in other than the recited order and that one or more steps illustrated may be optional. The methods and systems of the above-referenced embodiments may also include other additional elements, steps, computer-executable instructions, or computer-readable data structures. In this regard, other embodiments are disclosed herein as well that can be partially or wholly implemented on a computer-readable medium, for example, by storing computer-executable instructions or modules or by utilizing computer-readable data structures.

Thus, systems and methods for increasing speed of a standard cell library have been described.

What is claimed is:

1. A method for providing a high-speed cell library, the method comprising:

selecting a set of commonly-occurring logic functions;

obtaining a netlist of area distributions for each of the functions;

using the netlist to synthesize a set of cell libraries wherein an N-diffusion to P-diffusion area ratio differs among the cell libraries;

determining, using a computer, a time delay associated with each of the cell libraries; and ranking the cell libraries based on a comparison of a time delay associated with each of the cell libraries.

2. The method of claim 1, further comprising identifying the cell library associated with a time delay corresponding to a smallest time delay.

3. The method of claim 2, further comprising isolating a cell in the cell library including the smallest time delay, and determining for said isolated cell whether a signal path starting with a rising transition from a first node and propagating to a second node is critical, and, if the signal path is critical, speeding up a slower signal path from a first node to a second node and/or slowing down a faster path between the first node and the second node.

4. The method of claim 2, further comprising:
selecting a cell from the cell library including the time delay representing the smallest time delay, the cell comprising a plurality of implementations;
querying whether the selected cell includes symmetric inputs; and
if the selected cell does not include symmetric inputs, determining which of the implementations of the cell to include in the cell library.

5. The method of claim 2, further comprising:
collecting and analyzing cell statistics from the cell library including the time delay representing the smallest time delay;
based on the statistics, querying whether a single cell can be advantageously merged into a merged cell;
obtaining a list of cells that can be merged into one merged cell; and
re-optimizing the list of cells that can be merged into one merged cell.

6. The method of claim 1, further comprising adding a higher drive strength to each of the cells in a cell library in order to determine the optimum drive strength for each of the cells in the cell library.

7. The method of claim 1, further comprising adding a higher drive strength in pre-determined increments to each of the cells in a cell library in order to determine the optimum drive strength for each of the cells in the cell library.

8. One or more non-transitory computer-readable media storing computer-executable instructions which, when executed by a processor on a computer system, perform a method for increasing the speed of a cell library, the method comprising:
selecting a set of commonly-occurring logic functions;
obtaining a netlist of area distributions for each of the set of functions;
using the netlist to synthesize a plurality of cell libraries wherein an N-diffusion to P-diffusion area ratio is varied among the plurality of cell libraries;
determining a time delay associated with each of the cell libraries; and
ranking the cell libraries based on a comparison of a time delay associated with each of the cell libraries.

9. The one or more non-transitory computer-readable media of claim 8, further comprising computer-executable instructions which, when executed by a processor add a higher drive strength in pre-determined increments to each of the cells in a cell library in order to determine the optimum drive strength for each of the cells in the cell library.

10. A computer-aided design tool comprising a non-transitory computer-readable medium storing computer-executable instructions which, when executed by a processor, performs a method to increase a speed of a cell library, the method comprising:
selecting a set of commonly-occurring logic functions;
obtaining a netlist of area distributions for each of the set of functions;
using the netlist to synthesize a plurality of cell libraries wherein an N-diffusion to P-diffusion area ratio is varied among the plurality of cell libraries;
determining a time delay associated with each of the cell libraries; and
ranking the cell libraries based on a comparison of a time delay associated with each of the cell libraries.

11. The computer-aided design tool of claim 10, further comprising computer-executable instructions, which when executed by the processor:
add a higher drive strength in pre-determined increments to each of the cells in a cell library in order to determine the optimum drive strength for each of the cells in the cell library.

12. The computer-aided design tool of claim 10, further comprising computer-executable instructions, which when executed by the processor:
identify the cell library associated with a time delay corresponding to a smallest time delay.

13. The computer-aided design tool of claim 12, further comprising computer-executable instructions, which when executed by the processor:
isolate a cell in the cell library including the smallest time delay, and determining for said isolated cell whether a signal path starting with a rising transition from a first node and propagating to a second node is critical, and, if the signal path is critical, speeding up a slower signal path from a first node to a second node and/or slowing down a faster path between the first node and the second node.

14. The computer-aided design tool of claim 12, further comprising computer-executable instructions, which when executed by the processor:
select a cell from the cell library including the time delay representing the smallest time delay, the cell comprising a plurality of implementations;
query whether the selected cell includes symmetric inputs; and
if the selected cell does not include symmetric inputs, determine which of the implementations of the cell to include in the cell library.

15. The computer-aided design tool of claim 12, further comprising computer-executable instructions which, when executed by the processor:
collect and analyze cell statistics from the cell library including the time delay representing the smallest time delay;
based on the statistics, query whether a single cell can be advantageously merged into a merged cell;
obtain a list of cells that can be merged into one merged cell; and
re-optimize the list of cells that can be merged into one merged cell.

16. The computer-aided design tool of claim 10, further comprising computer-executable instructions, which when executed by the processor:

add a higher drive strength to each of the cells in a cell library in order to determine the optimum drive strength for each of the cells in the cell library.

17. The computer-aided design tool of claim 10, further comprising computer-executable instructions which, when executed by the processor:
add a higher drive strength in pre-determined increments to each of the cells in a cell library in order to determine the optimum drive strength for each of the cells in the cell library.

* * * * *